US008691678B2

(12) United States Patent
Hilty et al.

(10) Patent No.: US 8,691,678 B2
(45) Date of Patent: Apr. 8, 2014

(54) COMPOSITION AND METHOD FOR ALLOY HAVING IMPROVED STRESS RELAXATION RESISTANCE

(71) Applicant: Tyco Electronics Corporation, Berwyn, PA (US)

(72) Inventors: Robert Daniel Hilty, Harrisburg, PA (US); Valerie Lawrence, Dover, PA (US); George Jyh-Shann Chou, Mechanicsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 13/675,071

(22) Filed: Nov. 13, 2012

(65) Prior Publication Data

US 2013/0074993 A1 Mar. 28, 2013

Related U.S. Application Data

(62) Division of application No. 11/767,197, filed on Jun. 22, 2007, now Pat. No. 8,388,890.

(51) Int. Cl.
*H01L 21/20* (2006.01)

(52) U.S. Cl.
USPC ............................ 438/584; 420/441; 438/674

(58) Field of Classification Search
USPC .................................. 438/584, 674; 420/441
See application file for complete search history.

(56) References Cited

U.S. PATENT DOCUMENTS 5,783,318 A 7/1998 Biondo et al.
6,150,186 A 11/2000 Chen et al.
6,695,960 B1 2/2004 Bacos et al.
6,899,926 B2 5/2005 Narita et al.
2006/0011271 A1 1/2006 Kobayashi et al.

FOREIGN PATENT DOCUMENTS

DE 195 25 983 2/1996
EP 1 031 637 A1 8/2000
GB 910858 11/1962

OTHER PUBLICATIONS

J.K. Dennis and T.E. Such, Nickel and Chromium Plating, 1993, Third Edition, pp. 362-369, Woodhead Publishing Limited, Cambridge, England.

J.H. Kefalas, Effect of Electroplating Parameters on Magnetic Properties of Ni-Co Alloys, Mar. 1966, Journal of Applied Physics, vol. 37, pp. 1160-1161, Honeywell EDP, Waltham, Massachusetts.

(Continued)

*Primary Examiner* — Weiping Zhu

(57) ABSTRACT

A nickel based alloy coating and a method for applying the nickel based alloy as a coating to a substrate. The nickel based alloy comprises about 0.1-15% rhenium, about 5-55% of an element selected from the group consisting of cobalt, iron and combinations thereof, sulfur included as a microalloying addition in amounts from about 100 parts per million (ppm) to about 300 ppm, the balance nickel and incidental impurities. The nickel-based alloy of the present invention is applied to a substrate, usually an electro-mechanical device such as a MEMS, by well-known plating techniques. However, the plating bath must include sufficient sulfur to result in deposition of 100-300 ppm sulfur as a microalloyed element. The coated substrate is heat treated to develop a two phase microstructure in the coating. The microalloyed sulfur-containing nickel-based alloy of the present invention includes a second phase of sulfide precipitates across the grain (intragranular) that improves the stress-relaxation resistance of the alloy.

15 Claims, 3 Drawing Sheets

(56) References Cited

OTHER PUBLICATIONS

Duane W. Endicott and John R. Knapp, Jr., Electrodeposition of Nickel-Cobalt Alloy: Operating Variables and Physical Properties of the Deposits, Plating, Jan. 1966, pp. 43-60.

Dr. S. Alec Watson, Additions to Sulphamate Nickel Solutions, 1989, NiDI Technical Series No. 10 053, Nickel Development Institute, Solihull, England.

Extended European Search Report; EP 07 11 6734; dated Mar. 20, 2008.

Partial European Search Report; EP 07 11 6734; dated Jan. 21, 2008.

COMPOSITION AND METHOD FOR ALLOY HAVING IMPROVED STRESS RELAXATION RESISTANCE

CROSS REFERENCE TO RELATED APPLICATIONS

This application claims the benefit of U.S. Provisional Application No. 60/846,529 filed Sep. 21, 2006, and is a divisional application of co-pending patent application Ser. No. 11/767,197 filed Jun. 22, 2007, entitled "COMPOSITION AND METHOD FOR ALLOY HAVING IMPROVED STRESS RELAXATION RESISTANCE," now allowed and incorporated herein by reference in its entirety.

FIELD OF THE INVENTION

The present invention generally relates to an alloy for use in plating, and more particularly to a composition and method of producing and using the alloy for improved stress relaxation resistance or creep.

BACKGROUND OF THE INVENTION

Miniaturization of electronic devices has required innovation in the methods and materials used to fabricate smaller components. Electroplated metals can be fabricated, in a process called electroforming, at sufficient metal layers thicknesses such that the metal layers have substantial mechanical properties and may be used as structural members. Nickel is a common plated metal and alloys of nickel have been plated. Nickel is also a high temperature capable material with some ductility, thus it is a good candidate for mechanical structures. Additionally, nickel is electrically conductive, making it suitable for electronic applications.

As a pure metal, nickel is insufficient to meet the needs of some electroforming processes. The nickel plating can be alloyed with other metals to improve its strength, cost, ductility and thermal stability. Cobalt can be readily alloyed with nickel in the electroplating process. Cobalt levels as high as 60% by weight have been reported. Cobalt is a solid solution strengthener in a nickel cobalt alloy in which nickel is the base element. The alloy retains the face-centered cubic (FCC) crystal structure of the nickel alloy with some cobalt atoms substitutionally replacing nickel atoms in the FCC nickel lattice. Cobalt and nickel form a single phase solid solution alloy across substantially their complete composition range. In this single phase solid solution, some of the nickel atoms are replaced by cobalt atoms on the crystal lattice. The substitution of cobalt atoms for nickel atoms, which results in some lattice distortion with some strengthening of the alloy, acts to impede dislocation motion in the lattice and hence increase the yield strength and hardness of the metal. Cobalt additions can have other impacts as well, for example increases in magnetic permeability and modifying the curie temperature.

Sulfur is another common element resulting from electroplating solutions. Sulfur can be co-deposited in the nickel lattice during plating of nickel. Sources of sulfur can be tramp elements, such as sulfur-containing metallic impurities in the anode material, or in the form of intentional additives to the plating solution. Sodium saccharin or sodium naphthalene 1,3,6-trisulphonic acid are intentional additives used as a stress relievers in nickel plating processes. However, sulfur levels from intentional additions to the plating solution must be controlled in applications that are exposed to elevated temperatures. At temperatures greater than about 200° C. (392° F.), nickel sulfide can form and preferentially precipitate at the grain boundaries (intergranular precipitation), which can embrittle the metal. Because of the problems associated with sulfur, is an unwanted element in the plated product, which is desirably eliminated or reduced to the maximum extent possible.

Other organic additives can be used to improve plating performance. For electroforming operations, the thickness of the plating deposit and the uniformity of that thickness can be important. Watson described the use of 1,4 butyne diol as an additive in nickel plating to improve leveling of the nickel plating and throwing power. Boric acid is well known as a buffering agent and nickel bromide can be used to accelerate anode dissolution.

U.S. Pat. No. 6,150,186 discloses a process for plating a nickel-cobalt alloy, followed by a heat treatment process. One of the disclosed processes for depositing the alloy utilizes a plating bath the includes saccharin as an additive. The heat treating process at temperatures above about 200° C. (392° F.) transforms the as-plated structure to a structure having useful increases in materials properties as the coated material undergoes a transformation from a nanocrystalline, or amorphous, to a crystalline, or ordered, state. This process is called recrystallization and grain growth. Using the recommended heat treating processes produces an increase in crystal grain size as measured by x-ray diffraction. Endicott and Knapp showed that the microstructure can also convert from a layered structure to a more equiaxed structure as a result of heat treating nickel cobalt alloys.

While nickel based superalloys have often used rhenium as an alloying agent, these alloys use rhenium to retard other changes that may occur in the structure with time at temperature or for its refractory capabilities. These alloys cannot generally be manufacturing by electroplating and do not have the same composition as disclosed herein. Their chemical composition is a complex stew designed to maximize performance at elevated temperatures, usually above 538° C. (1000° F.). The complex composition also develops a complex microstructure that is suited to the environment that it will be used in, the microstructure developed by performing a complex heat treatment.

Nickel based superalloys have often used rhenium as an alloying agent to provide solution strengthening of the matrix phase or gamma phase of a two phase gamma-gamma prime ($\gamma$-$\gamma'$) structure at elevated temperatures for use in power generation applications in which the operating temperature is typically in the range of 1100-1200° C. (2000-2200° F.). However, these alloys use rhenium to retard other changes that may occur in the structure with time at these elevated temperature or for its refractory capabilities. These complex alloys are usually single crystal or directional in structure manufactured by casting techniques and remelting, followed by heat treatments to develop the single or directional crystal structure having complex precipitates. These complex alloys cannot generally be manufacturing by electroplating and do not have the same composition as disclosed here.

U.S. Pat. No. 6,899,926 discloses a plating process to make a rhenium alloy deposit which can contain nickel and cobalt. However, this alloy claims a rhenium content of 65% to 98% Re.

The state of the art to date has provided methods and materials to produce high temperature stable metals. These alloys can be used to electroform electro-mechanical structures of various shapes and sizes. In applications of interest now, the alloys must be used at continuous operating temperatures in excess of 150° C. (302° F.). The existing materials and processes provide insufficient performance in this temperature regime.

A critical mechanical property of interest is stress relaxation. Stress relaxation in metals is the reduction of tensile stress or applied force in a metallic member when deformed under a constant strain for a prolonged time. The relaxation can occur with time and is typically accelerated by increasing the storage temperature. This property can be measured in many ways. FIG. 1 shows an example of a stress relaxation plot for a heat treated nickel cobalt alloy exposed to a strain of 20% at 175° C. (347° F.) as measured in a dynamic mechanical analyzer (DMA). The alloy can support an initial load of 5 newtons, but after aging for 2500 minutes at 175° C. (347° F.), the alloy can only support 1.47 newtons. This is a relaxation of 70.6% of the original tensile strength of the material, alternatively stated as the material having only 29.4% stress remaining A metallurgical phenomenon similar to stress relaxation is creep. The operating mechanisms are the same for creep and stress relaxation, but differ slightly in that in a creep application, the applied force or stress remains constant while the strain changes with time. For the purposes of this invention, stress relaxation and creep will be considered equivalent, if not identical, metallurgical mechanisms.

SUMMARY OF THE INVENTION

A nickel based alloy coating and a method for applying the nickel based alloy to a substrate is disclosed. The nickel based alloy comprises about 0.1-15% rhenium, about 5-55% of an element selected from the group consisting of cobalt, iron and combinations thereof, sulfur included as a microalloying addition in amounts from about 100 parts per million (ppm) to about 300 ppm, the balance nickel and incidental impurities. Unless otherwise specified, all compositions are provided as percentages by weight. As used herein, nickel-based alloy deviates, for simplicity, from the normal understanding of "nickel-based alloy." Nickel-based typically is understood to mean that nickel comprises the largest percentage of the alloy. It will be understood that an alloy of the present invention may include cobalt as the largest percentage of the alloy and is in fact a cobalt-based alloy, but will be referred to herein as a nickel-based alloy since it retains the face-centered cubic (fcc) nickel crystal structure.

The nickel-based alloy of the present invention is applied to a substrate by well-known plating techniques. However, the plating bath must include sufficient sulfur to result in deposition of 100-300 ppm sulfur. Usually, sulfur (S) in an alloy composition is an unwanted tramp element that is desirably completely eliminated from the composition, but, if not eliminated, kept to the lowest concentration possible. In the present invention, S is an intended alloying element that has beneficial effects when maintained within the strict compositional limits. The microalloyed sulfur-containing nickel-based alloy of the present invention includes a second phase of sulfide precipitates across the grain (intragranular) that improves the stress-relaxation resistance of the alloy.

The second phase of sulfide particles produces fine intragranular precipitates of Rhenium sulfide ($ReS_2$) which are stable in the temperatures of interest for miniaturized electronic devices. These devices operate continuously above 150° C. (300° F.) and the stability of the second phase of $ReS_2$ at these temperatures provides a component for an electronic device, such as a connector, which is not susceptible to stress relaxation at these continuous operating temperatures. For many contact applications, metals serve both mechanical and electrical purposes. Devices such as springs can benefit from this technology by retaining an applied force or resisting deformation due to creep. In electrical interconnections, this is typically desirable since the electrical resistance of the contact interface is related to the applied normal force between the contacts. For micro-electro-mechanical systems (MEMS), plated structures must resist stress relaxation to keep latches engaged or activate circuits. Since many of these devices operate at elevated temperatures, the creep and stress relaxation mechanisms occur more readily. Thus, engineering the metallic structures to resist deformation is critical.

Other features and advantages of the present invention will be apparent from the following more detailed description of the preferred embodiment, taken in conjunction with the accompanying drawings which illustrate, by way of example, the principles of the invention.

DETAILED DESCRIPTION OF EMBODIMENTS OF THE INVENTION

Figure 1:
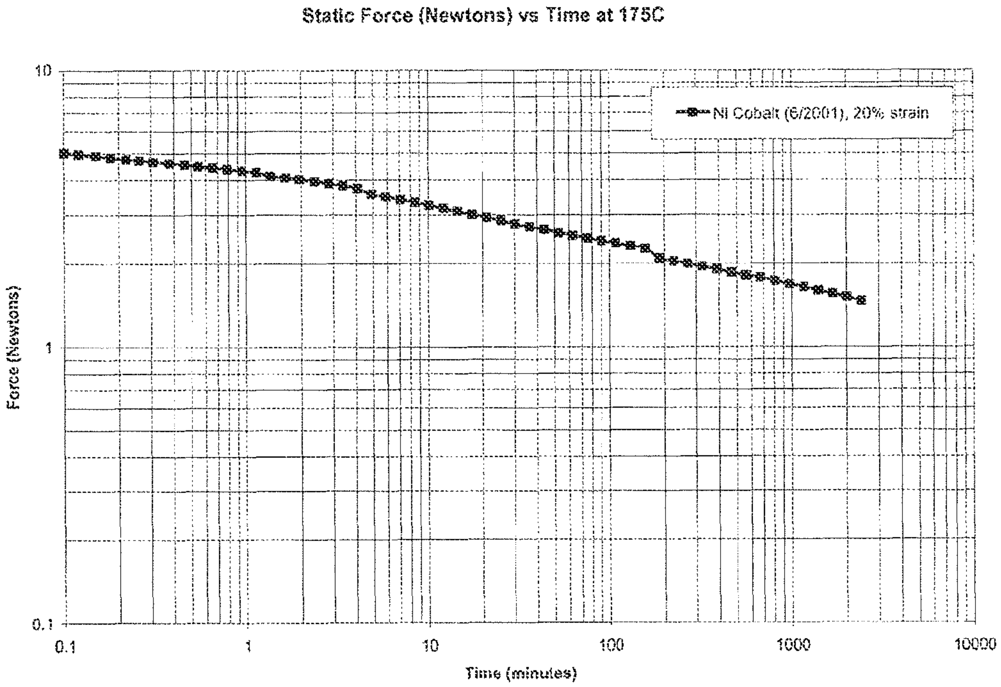
FIG. 1 provides a stress relaxation resistance plot for a heat treated nickel-cobalt alloy exposed to a strain of 20% at 175° C. (347° F.) as measured in a dynamic mechanical analyzer (DMA)

The embodiments disclosed below are not intended to be exhaustive or to limit the invention to the precise forms disclosed in the following detailed description. Rather, the embodiments are chosen and described so that others skilled in the art may utilize their teachings.

This invention is a nickel-based alloy and process for making a nickel-based alloy which has improved stress relaxation resistance at elevated temperatures. It is ideally suited for electro-mechanical devices but may find use in other applications where strength, creep resistance and stress relaxation resistance are required.

Stress relaxation occurs as the stress applied to a metal structure is reduced, often by dislocation glide. Dislocation glide is temperature-related, the dislocations moving through the structure more quickly at elevated temperatures. Improving stress relaxation performance requires the ability to impede dislocation motion, in particular dislocation glide. Dislocation glide may be impeded by avoiding elevated temperatures. Frequently, this is not an option Dislocation glide also can be interrupted or impeded by defects in the crystal structure. Some defects have minimal impact on dislocation mobility, while others can pin or fix dislocations.

Point defects, such as vacancies, interstitials and solid solution atoms, have only a modest impact on dislocation glide. Solid solution atoms have their largest effect on dislocation motion when the atomic radii differences between the solvent and solute atoms are large. In the case of cobalt and nickel, the differences are small. The additional energy applied to the structure by a stress readily provides the energy required to move the dislocations over or around such point defects.

Line defects, such as other dislocations, can slow down dislocation motion and offer some improvements over point defects in impeding dislocation motion in a structure subjected to a stress, but these effects are minimal at elevated temperatures, as these temperatures contribute further energy for dislocation motion.

A more effective method for impeding dislocation motion at elevated temperatures is the inclusion of second phase particles in the crystal structure. In this case, the dislocations must glide around the relatively large particles or perturbations in the otherwise regular crystal structure, or slice through the particles in order to continue gliding. When a large number of these particles are present, it becomes progressively more difficult for these dislocations to glide or move past these particles. Even though these particles can be small, compared to lattice vacancies or solid solution atomic substitutions, which are present in the lattice essentially on an atomic scale, these particles, by comparison, are large. Second phase particle inclusions are typical tools for the metallurgist and are found in other stress relaxation-resistant metal alloys such as copper-beryllium and copper-zirconium.

The present invention is an alloy and process which produces a two-phase microstructure that is capable of impeding dislocation glide and improving stress relaxation resistance even at elevated temperatures. The metal is a nickel-based (Ni-based) alloy with additions of cobalt (Co), rhenium (Re) and sulfur (S). The sulfur is intentionally present as an alloying element and maintained within carefully prescribed limits. The sulfur is an essential ingredient in forming the second phase structure that provides the stress relaxation resistance to the present invention. The Ni-based alloy is then heat treated to develop the two-phase microstructure that is thermally stable at elevated temperatures and that produces improved stress relaxation resistance.

The cobalt levels can be varied from 5 to 55% by weight. Cobalt is a solid solution strengthener and provides additional strength to the alloy. Heat-treated nickel-cobalt alloys have a strength maximum at a preferred concentration of 40 to 45% by weight. Thus, other cobalt levels can be used, but the strength is maximized at a content around 40% by weight, which is the most preferable cobalt content. Cobalt may also provide some magnetic properties to the alloy, which may prove to be beneficial for certain applications.

Rhenium is added to the alloy to serve two essential purposes. First, it is a solid solution strengthener. Rhenium, being a larger atom than either Ni or Co, distorts the lattice structure significantly more when it replaces either Ni or Co. Second, and more importantly, it is one of the two elements required to form a second phase in a NiCoReSX alloy where X may represent any other element that may be included in the alloy either as an intentional addition or as present as a tramp element.

The process for applying the alloy of the present invention is a deposition method. While any deposition method that effectively applies the alloy may be used, methods that do not require heating to temperatures at or near the melting point of the alloy are preferred. Most preferably, the alloy is applied by electroplating. Some of the rhenium content is soluble in a nickel plating solution and replaces the nickel atoms in the lattice as the plating is deposited. Sulfur is another element that is present in electroplating solutions. It also is deposited as the plating is deposited. Sulfur is a smaller element than either Ni, Co or Re. While sulfur can occupy space between the atoms in the crystal lattice, that is, as an interstitial atom, it tends to accumulate preferentially at the grain boundaries in the form of nickel sulfide, such as when sulfur is present in pure nickel. This nickel sulfide preferentially concentrated at the grain boundaries is undesirable, as it results in a deterioration in the physical properties of the alloy. One of the properties that is deteriorated by this "free" sulfur is alloy strength. However, rhenium will react with the co-deposited sulfur to "tie-up" the "free" sulfur. This has two positive effects: first, it removes the sulfur from the nickel matrix, thereby reducing the risk of forming nickel sulfide; and second, the rhenium combines with the sulfur to produce a fine dispersion of rhenium sulfide particles within the FCC crystal structure when the alloy is heat treated properly. These second phase particles distributed through the FCC crystal structure or matrix impede dislocation motion as discussed above.

Figure 2:
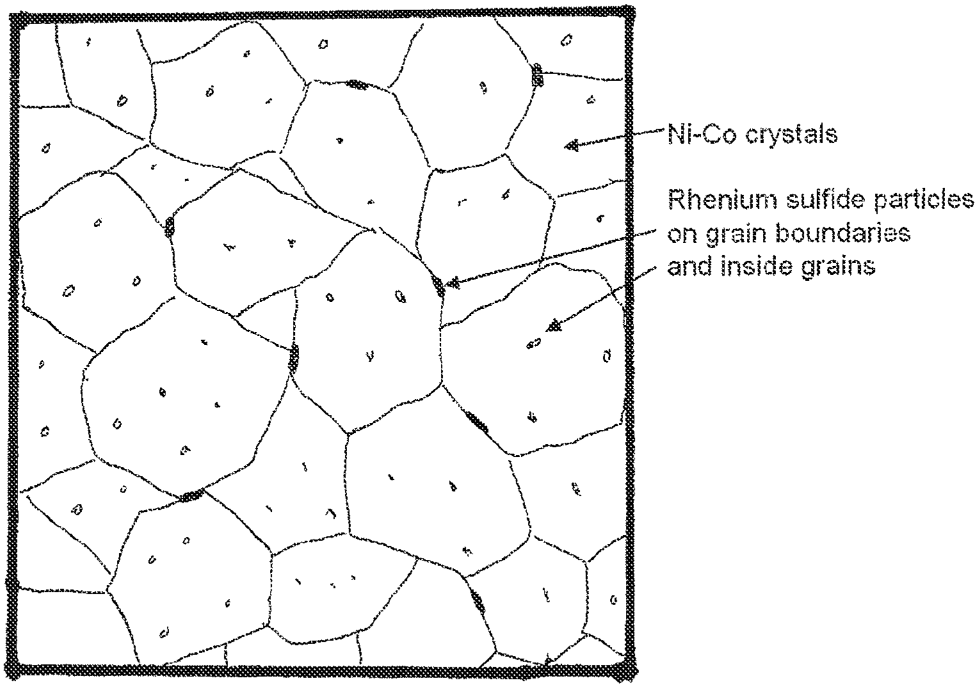
FIG. 2 is a schematic of two phase microstructure of a NiCoRe alloy showing the nickel crystals with cobalt solid solution strengthening and the second phase inclusions of $ReS_2$ depicting the $ReS_2$ inclusions both as intragranular and at the grain boundaries.

Since both rhenium and nickel will react with sulfur, the rhenium content in the deposit must be sufficient to preferentially form the stable $ReS_2$ precipitate instead of forming nickel sulfide. A schematic of a developed two phase microstructure of a NiCoRe alloy showing substantially contiguous nickel with cobalt solid solution strengthened grains having an fcc-structure, and the second phase of $ReS_2$ depicting the $ReS_2$ inclusions both within the grains (intragranular) and at the grain boundaries is depicted in FIG. 2. Usually, about 2 to 6% rhenium by weight is co-deposited as an alloying element. In the preferred embodiment, Re is included in the electroplating solution and is deposited with the nickel and cobalt. Manganese (Mn) is also a well-known scavenger for sulfur and also can be co-deposited with Ni, Co and S. While manganese will also form manganese sulfide particles, it is not the preferred alloying element since the manganese electrode potential is less compatible with nickel plating, making it more difficult to co-deposit. If manganese were used instead of rhenium, the alloy concentration would be slightly higher than for rhenium, due to their differences in atomic weight, and would reside in the range of 2-7% by weight. While rhenium is preferred, either of these produce a desired sulfide precipitate that preferentially forms instead of $NiS_2$ Sulfur is co-deposited from several sources in a plating bath. Sulfur content in the bath is limited by the ability to co-deposit and usually has a concentration around 100 to about 300 parts per million, by weight.

The preferred method of deposition is plating, however other deposition techniques could also be used, such as physical vapor deposition (PVD) and chemical vapor deposition (CVD). CVD and PVD processes will require a layered structure or an alloyed target in order to achieve the desired alloy concentration in the deposit.

In an exemplary embodiment of the present invention, the alloy is made using the following process. In the exemplary embodiment, the plating electrolyte may have the following composition: Nickel Sulfamate, 515 ml/l, Cobalt sulfamate, 51.8 ml/l, Boric acid, 34.7 g/l, Wetting agent, 4ml/l, Nickel bromide, 2.81 ml/l, Sodium saccharine, 100 mg/l, 1,4 butyne diol, 3.75 mg/l, Potassium perrhenate, 3 g/l, Water, approximately 400 ml/l, sufficient to bring volume up to 1 liter. Nickel carbonate and sulfamic acid may also be added to adjust the pH of the plating bath. The plating bath can be operated at a variety of temperatures, but an optimal temperature is 50 C. The plating anodes are commercially available nickel "S-rounds", which are soluble nickel anodes containing sulfur as an intentional additive or alloying element. While the plating electrolyte is believed to be novel, the plating process is otherwise conventional.

Figure 3:
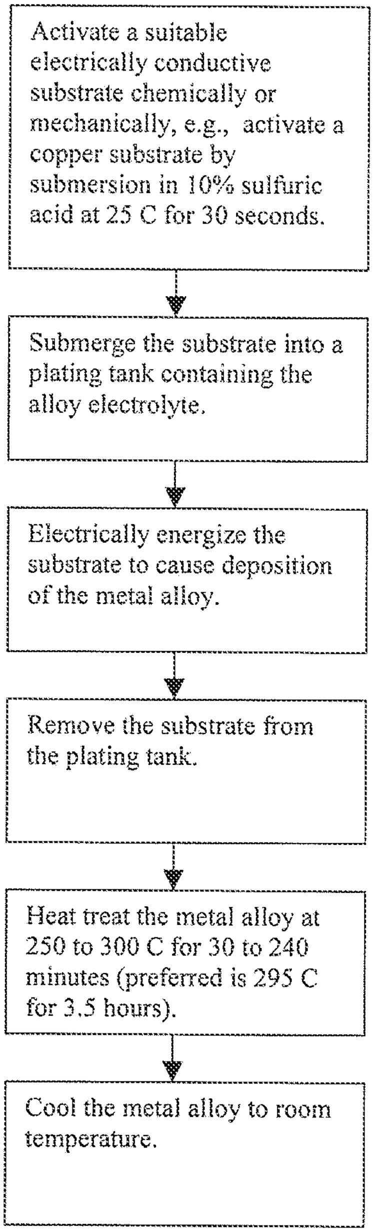
FIG. 3 is a process flow chart for fabricating NiCoReS alloys.

The preferred process of applying the nickel-cobalt-rhenium-sulfur alloy of the present invention is depicted by the flow chart of FIG. 3. The process appears to be a standard electrolytic treatment, in that a substrate is selected and activated by the usual activation processes, which is cleaning. Here, an acid treatment is utilized to clean the substrate. The process differs in that the plating solution includes ions of rhenium, cobalt and nickel, and the sulfur content of the solution is maintained so as to only allow for the presence of about 100-300 ppm of sulfur in the deposited alloy. In addition to the unique composition of the plating bath, after the substrate is plated and removed from the plating bath, the plated substrate is heat treated in the temperature range of about 250-300° C. (482-572° F.) to develop the precipitates in the plating. The elevated temperature treatment also allows diffusion of the cobalt within the nickel matrix which serves to homogenize the alloy. This will occur fairly rapidly at these elevated temperatures. The microstructure that is developed is depicted in FIG. 2.

FIG. 1 graphically illustrates the stress relaxation resistance for a heat treated nickel-cobalt alloy exposed to a strain of 20% at 175° C. (347° F.) as measured in a dynamic mechanical analyzer (DMA). It is a log-log plot which depicts a nickel-cobalt alloy stress relaxation at a constant elevated temperature over a period of time.

Figure 4:
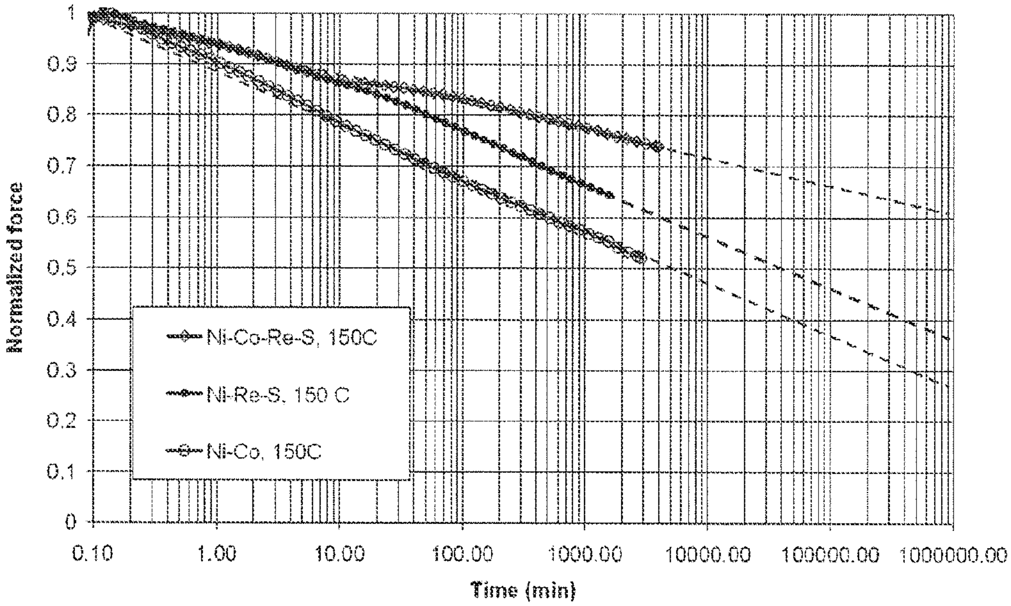
FIG. 4 provides a stress relaxation resistance plot of three nickel alloys at 150° C. (302° F.)
Figure 5:
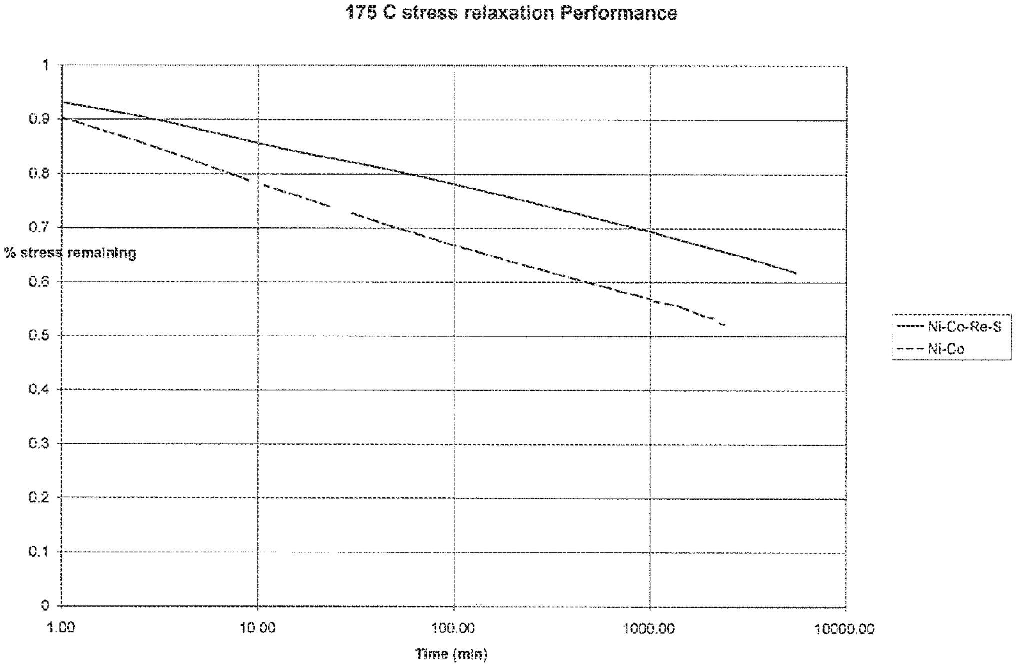
FIG. 5 compares the stress relaxation resistance plot of NiCo alloy and a NiCoReS at 175° C. (347° F.).

In the exemplary embodiment of the present invention, the alloy will have the following performance. The performance of the alloy is demonstrated by the data of FIG. 4. The figure shows the stress relaxation performance comparison of three nickel alloys. Ni—Co (bottom line-large open circles) and Ni—Re—S (middle line-small solid circles) are current alloys. The Ni—Co—Re—S alloy disclosed herein is shown as the top line-diamonds. The data show that Ni—Co—Re—S has the best stress relaxation resistance of any of these alloys. FIG. 5 depicts the stress relaxation performance of the alloy of the present invention (solid line) against that of a baseline nickel-cobalt alloy (dashed line). The superior stress relaxation performance of the alloy of the present invention is clear.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of providing an electromechanical device having improved stress relaxation resistance, comprising the steps of:

providing an uncoated electromechanical device as a substrate;

applying a coating of nickel (Ni), cobalt (Co), rhenium (Re) and sulfur (S) to the substrate; and heat treating the coated substrate to produce an alloy coating having a two phase microstructure characterized by thermal stability and improved stress relaxation resistance.

2. The method of providing an electromechanical device of claim 1 wherein the step of applying the coating is selected from the group consisting of electrolytic plating, chemical vapor deposition and physical vapor deposition.

3. The method of providing an electromechanical device of claim 2 wherein the step of applying a coating further comprises electrolytic plating a coating to at least a portion of the substrate.

4. The method of claim 3 wherein the step of applying the coating by electrolytic plating further includes:

preparing an electrolytic plating bath, the bath comprising nickel sulfamate, cobalt sulfamate, sodium saccharine, and potassium perrhenate in a liquid, then placing the substrate in the plating bath, then applying a current to the bath.

5. The method of claim 4 wherein the step of preparing the electrolytic plating bath includes preparing a bath that includes 515 ml/l nickel sulfamate, 51.8 ml/l cobalt sulfamate, 34.7 g/l boric acid, 4 ml/l wetting agent, 2.81 ml/l nickel bromide, 100 mg/l sodium saccharine, 3.75 mg/l 1,4 butyne diol, 3 g/l potassium perrhenate, and about 400 ml/l water, sufficient to bring volume up to 1 liter.

6. The method of providing the electromechanical device of claim 4 further including adding nickel carbonate and sulfamic acid to adjust the pH of the plating bath.

7. The method of providing an electromechanical device of claim 4 further comprising operating the plating bath at a temperature of about 50° C.

8. The method of providing an electromechanical device of claim 4, wherein the step of preparing an electrolytic plating bath further includes providing soluble nickel "S-round" plating anodes.

9. The method of providing an electromechanical device having improved stress relaxation resistance of claim 1 wherein the step of applying a coating includes applying a coating having a composition comprising about 0.1-15% rhenium, about 5-55% of at least one element selected from the group consisting of Co, iron and combinations thereof, S included as a microalloying addition in an amount of about 100-300 ppm and the balance Ni and incidental impurities.

10. The method of providing an electromechanical device having improved stress relaxation resistance of claim 9 wherein the composition includes about 40-45% Co.

11. The method of providing an electromechanical device having improved stress relaxation resistance of claim 1 wherein the step of heat treating the coated substrate includes heat treating in the temperature range of about 250-300° C. for a time sufficient to develop the two phase microstructure.

12. The method of providing an electromechanical device having improved stress relaxation resistance of claim 1 wherein the step of heat treating develops a two phase microstructure comprising intragranular precipitates dispersed in a contiguous matrix.

13. The method of providing an electromechanical device having improved stress relaxation resistance of claim 12 wherein the intragranular precipitates are $ReS_2$.

14. The method of providing an electromechanical device having improved stress relaxation resistance of claim 12 wherein the contiguous matrix is a face centered cubic structure.

15. The method of providing an electromechanical device having improved stress relaxation resistance of claim 1 wherein the step of providing an uncoated electromechanical device includes providing a micro-electro-mechanical system (MEMS).

* * * * *